METHOD OF SEVERING A SEMICONDUCTOR WAFER

Filed July 3, 1968

INVENTORS

JACOBUS EIGEMAN
HERMANUS A. Van de PAS

BY Frank R. Trifari
AGENT 3,537,169

METHOD OF SEVERING A SEMICONDUCTOR WAFER

Jacobus Eigeman and Hermanus Antonius van de Pas, Nijmegen, Netherlands, assignors, by mesne assignments, to U.S. Philips Corporation, New York, N.Y., a corporation of Delaware Filed July 3, 1968, Ser. No. 742,250
Claims priority, application Netherlands, July 8, 1967, 6709523
Int. Cl. B23p *17/00*
U.S. Cl. 29—413 8 Claims

ABSTRACT OF THE DISCLOSURE

A method of severing a semiconductor wafer is disclosed whereby the wafer is electrostatically held to a flexible synthetic resin foil and is then grooved and subjected to bending forces to divide said wafer into a plurality of parts. The foil is then positioned on a support over an empty space and is heated so that the foil sags downward and effects a spaced separation among the wafer parts. The foil is then cooled to permanently set same.

Figure 1:
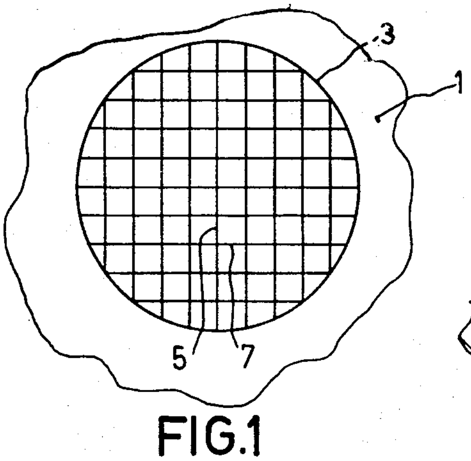

The invention relates to a method of severing a semiconductor wafer, in which a wafer to be severed is secured on a foil of synthetic resin and is divided into a large number of parts along a number of grooves provided in the surface of the wafer remote from the foil. Such a method is known and is used, for example, for manufacturing crystals of semiconductor material for a semiconductor device such as, for example, a transistor.

In the known method, the semiconductor wafer is stuck to a self-adhering foil and is then broken into parts by suitably exerted bending movements along a number of grooves provided in the wafer by scratching. Subsequently, in a bath containing a suitable solvent, the wafer parts are removed from the foil, cleaned and sorted. Since during these operations, the regular order of the wafer parts engaging each other by their surfaces of fracture after severing of the plate is disturbed, an additional orientating operation is required afterwards in order that the wafer parts may each be supplied in a prescribed position to further processing machines. The method described requires a large number of operations which are both time-consuming and expensive.

The invention has for an object to provide a considerably simpler method so that the manufacturing cost can be materially reduced.

The invention is based on recognition of the fact that it is advantageous when the order of the wafer parts is not disturbed during the process but is maintained until these wafer parts are supplied in order of succession to the said processing machines. As a result, the aforesaid sorting operations can be carried out when the wafer parts are still held on the foil.

This order of succession can be readily attained if, according to the invention, after the wafer has been severed, the foil is extended so that the wafer parts secured on the foil are permanently spaced apart. When the relevant wafer parts are spaced apart, for example, by distances of 0.5 mm., they can be more readily examined for damage than when they engage each other on the foil by their surfaces of fracture. A further advantage of spacing the wafer parts resides in the fact that a hollow needle communicating with a subatmospheric pressure system can be used, which can each time remove by its suction opening an approved wafer part from the foil without a disturbing influence of adjacent wafer parts or without these adjacent wafer parts being influenced. Also due to the fact that the orientation of the wafer parts spaced apart is substantially not disturbed, this hollow needle can pick up essentially all the wafer parts in the same pre-orientated manner, as a result of which a separate orientation of each individual wafer part with respect to the needle becomes superfluous.

In the method according to the invention, which permits of drastically mechanizing the manufacture and further processing of crystals for semiconductor devices, the foil is preferably extended omnidirectionally in its own plane when the semiconductor wafer is severed along at least two intersecting sets of parallel grooves.

It has further been found recommendable for the semiconductor wafer parts to be held electrostatically on the foil at least during the extension of said foil. Advantageously , a non-pre-stretched foil is used, which has a satisfying electrostatic charge and to which the wafer parts adhere during the extension, while they can be readily removed by the said needle from the foil after the extension. Thus, it is not necessary to use the known self-adhering foils; the lower side of the semiconductor wafer is then not contaminated. As a result, the detached wafer parts need no longer be cleaned, as was always necessary hitherto. A suitable material for the foil is, for example, a polyvinylchloride commercial available under the tradename of "Genotherm 1000." The electrostatic charge is inherent to this material.

The invention further relates to a device for carrying out the method described above. This device is characterized in that it comprises a chamber adapted to communicate with a subatmospheric pressure system and means by which a foil supporting a number of wafer parts and closing the peripheral edge of the chamber is heated preferably by thermal radiation, so that this foil is extended in its own plane by sagging when a subatmospheric pressure is created in the chamber.

Figure 2:
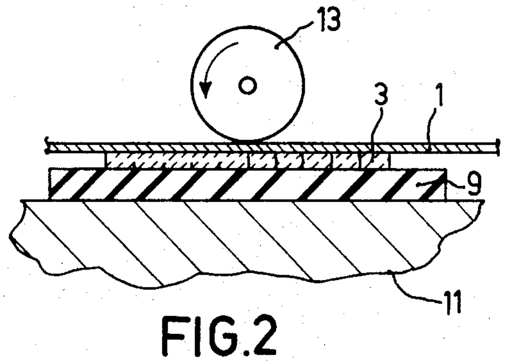

The invention will be described with reference to the drawing, in which:

FIG. 1 is a plan view of a foil and a semiconductor wafer secured on it,

FIG. 2 relates to the process of severing the wafer of FIG. 1.

Figures 3, 4:
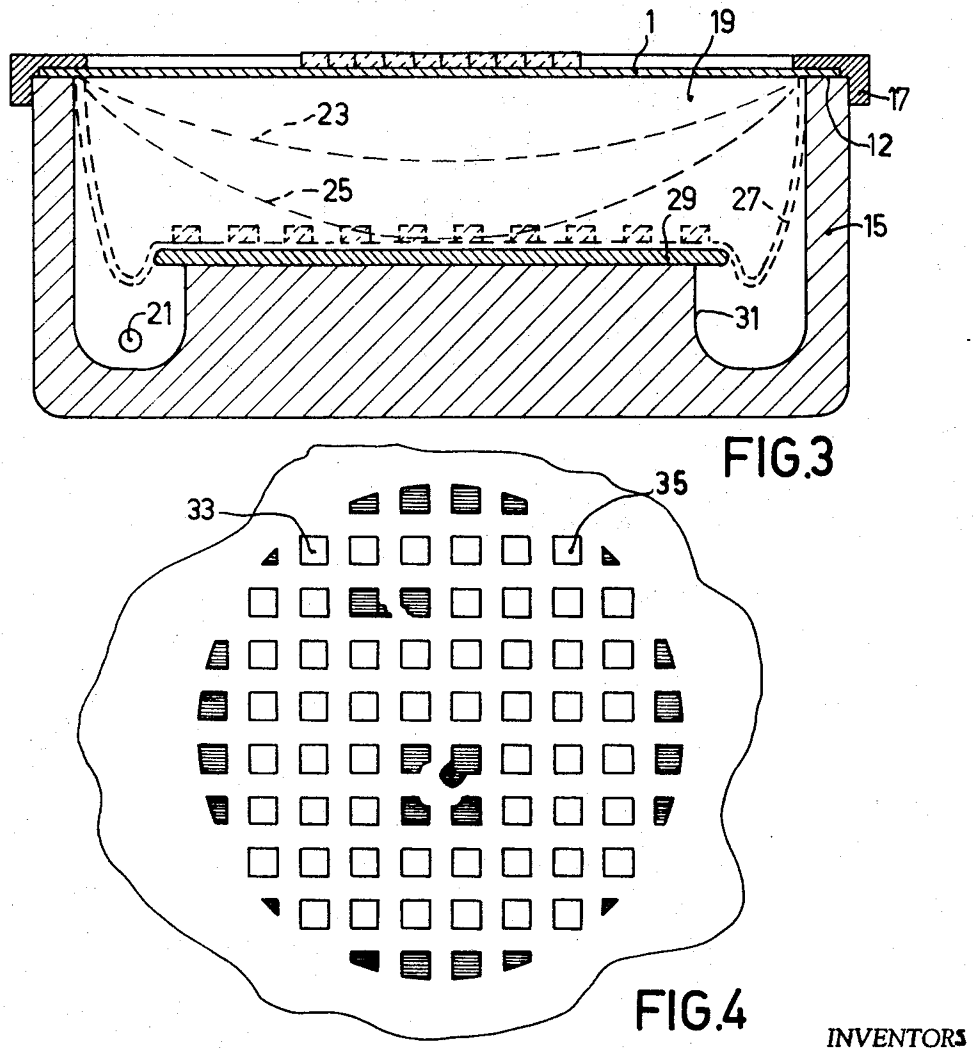

FIG. 3 is a diagrammatic cross-section of the device for carrying out the method according to the invention, and FIG. 4 shows a foil with wafer parts processed by means of the device shown in FIG. 3.

Referring now to FIG. 1, reference numeral 1 denotes a non-pre-stretched foil of synthetic resin, which has a satisfying electrostatic charge and on which a semiconductor wafer 3 is held electrostatically. The foil consists of a polyvinylchloride commercially available under the tradename of "Genotherm 1000," which has proved very suitable, the electrostatic charge being inherent to this material. The wafer 3 is to be divided into a large number of parts which each may form a crystal for a semiconductor device.

For this purpose, the surface of the wafer 3 is provided by scratching with two intersecting sets of parallel grooves 5 and 7. Subsequently, the wafer is disposed on a resilient layer 9 which in turn bears on the rigid sheet 11 of a sledge (not shown) adapted to move in a reciprocatory manner. The assembly is urged by a roller 13. When the sledge is moved below the roller, the wafer 3 is exposed to bending moments and breaks into parts along the grooves 5 and 7. In the method according to the invention, the foil 1 with wafer parts thus obtained is disposed on the upper rim 12 of a housing 15 and is clamped by means of a ring 17.

In the arrangement shown in FIG. 3, the foil is heated by switching on a heating lamp (not shown) arranged just above the foil. Subsequently, a subatmospheric pressure is created in the chamber 19 closed by the foil 1 through an opening 21 in the wall of the chamber communicating with a subatmospheric pressure system. As a result, this foil is omnidirectionally extended and occupies successively the positions 23 and 25 and it sags until it is located in the position 27 on the upper side of a rigid plate 29 which has been disposed before on an elevation 31 in the bottom of the housing 15. The lamp is then switched off so that the foil is cooled and its extension is maintained. It is not until then that the subatmospheric pressure in the chamber 19 is eliminated. In the last position 27, all the wafer parts on the foil are spaced apart by a certain distance, which is shown in greater detail in FIG. 4. In a practical case, this distance was 0.5 mm. The central part of the foil on which the wafer parts are located is then separated from the remaining part of the foil.

It is recommendable for the upper surface of the plate 29 to be provided with a layer of glue so that the foil slightly adheres to this plate. Thus, the manipulability of the plate 29 with the foil 1 is considerably increased.

The plate 29 with the foil 1 provided with wafer parts can now be visually checked, the wafer parts having disapproved surfaces of fracture being externally marked by a suitable colouring agent. By way of example, these wafer parts are dark coloured in FIG. 4. The plate 29 with the foil is then supplied to suitable processing machines, in which only the approved wafer parts can be successively detached from the foil by means of a pick-up head or needle operating at a subatmospheric pressure. Since the wafer parts are spaced apart by a certain distance, an approved wafer part can be detached from the foil without a disturbing influence of adjacent wafer parts, while the location of the adjacent wafer parts is not influenced either by the said pick-up head.

Also due to the fact that the original order of the wafer parts on the foil has been hardly disturbed by the extension operation, a foil thus supplied can be processed at high speed. The angular positions of only a few of the wafer parts on a foil, for example, of the wafer parts 33 and 35, need be orientated with respect to a pick-up head. This is then not necessary for the remaining wafer parts; it is sufficient to move the plate 29 in two orthogonal directions with respect to the pick-up head or needle.

For the sake of clarity, the elevation 31 in FIG. 3 is shown on an exaggerated large scale with respect to the remaining dimensions of the housing 15. In actual fact, both the height and the width of this elevation are considerably smaller. It will be appreciated that inter alia the distance in the direction of height between the foil in the non-sagged state and the plate 29 is a measure for the degree of extension of the foil. In practice this distance might be, e.g., 3–6 cm. dependent on the original diameter of the wafer 3 and the required distance between the wafer-parts after the foil is extended. The degree of extension may be adjusted by adjusting the said distance in the direction of height, for example, by placing auxiliary members on the elevation 31 in order to reduce the said distance.

What is claimed is:

1. A method of dividing a semiconductor wafer into a plurality of parts and separating the parts while maintaining their relative positions with respect to each other, comprising the steps of adhering the wafer on an electrostatically charged synthetic resin foil, dividing the wafer while held electrostatically on the foil into a plurality of parts, thereafter substantially omnidirectionally extending in its own plane the foil with the wafer parts still held electrostatically on its surface effecting a permanent spaced separation among the wafer parts while maintaining their relative positions with respect to each other.

2. A method as set forth in claim 1 wherein the wafer is divided by first providing a number of intersecting parallel grooves in the surface of the wafer remote from the foil, and thereafter subjecting the grooved wafer to bending forces to break the wafer substantially along the grooves into plural parts.

3. A method as set forth in claim 2 wherein after the foil has been extended separating the wafer parts, the foil is secured on a rigid substrate with the wafer parts still held electrostatically thereon.

4. A method of dividing a semiconductor wafer into a plurality of parts and separating the parts while maintaining their relative positions with respect to each other, comprising the steps of adhering the wafer on a heat-softenable, flexible, synthetic resin foil, dividing the wafer into a plurality of parts, thereafter heating the foil and subjecting it to forces causing it to extend substantially omnidirectionally in its own plane effecting a spaced separation among the wafer parts while maintaining their relative positions, and thereafter cooling the foil to permanently set same in its extended position.

5. A method as set forth in claim 4 wherein the wafer is adhered to the foil by electrostatic charges.

6. A method of dividing a semiconductor wafer into a plurality of parts and separating the parts while maintaining their relative positions with respect to each other, comprising the steps of providing the wafer on an electrostatically charged, flexible, synthetic resin foil, providing a number of grooves in the surface of the wafer remote from the foil, subjecting the grooved wafer while held electrostatically on the foil to bending forces to break the wafer substantially along the grooves into a plurality of parts, thereafter positioning the foil with the wafer parts still held electrostatically on its surface on a support over an empty space and clamping the foil edges to the support, thereafter reducing the pressure below atmospheric within the empty space underneath the foil and heating the foil causing it to sag downward and causing the foil to extend omnidirectionally in its own plane effecting a spaced separation among the wafer parts while maintaining their relative positions, and thereafter cooling the foil to permanently set same in its extended position.

7. A method as set forth in claim 6 wherein the foil is sagged downward onto a planar support and the foil is adhered to the planar support.

8. A method as set forth in claim 6 wherein the foil is non-porous.

References Cited

UNITED STATES PATENTS

| | | | |
|---|---|---|---|
| 2,970,730 | 2/1961 | Schwarz | 225—2 |
| 3,040,489 | 6/1962 | Da Costa | 29—413 X |
| 3,206,088 | 9/1965 | Meyer et al. | 225—2 |
| 3,384,279 | 5/1968 | Grechus | 225—2 |
| 3,448,510 | 6/1969 | Bippus et al. | 29—413 |

JOHN F. CAMPBELL, Primary Examiner

V. A. DI PALMA, Assistant Examiner

U.S. Cl. X.R.

18—19; 29—582, 626; 214—1; 225—2